(12) United States Patent
Byeon (10) Patent No.: US 7,190,618 B2
(45) Date of Patent: Mar. 13, 2007

(54) SEMICONDUCTOR DEVICE FOR REDUCING COUPLING NOISE

(75) Inventor: Dae-Seok Byeon, Youngin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 268 days.

(21) Appl. No.: 10/915,555

(22) Filed: Aug. 11, 2004

(65) Prior Publication Data

US 2005/0213381 A1    Sep. 29, 2005

(30) Foreign Application Priority Data

Mar. 25, 2004    (KR) ............... 10-2004-0020424

(51) Int. Cl.
*G11C 11/34* (2006.01)

(52) U.S. Cl. ............... 365/185.12; 365/185.17; 365/185.33

(58) Field of Classification Search ........... 365/185.11, 365/185.33, 185.12, 185.17

See application file for complete search history.

(56) References Cited

U.S. PATENT DOCUMENTS

| 6,704,239 B2 * | 3/2004 | Cho et al. ............... 365/230.04 |
| 6,798,697 B2 * | 9/2004 | Hosono et al. ........ 365/185.12 |
| 6,963,502 B2 * | 11/2005 | Park ....................... 365/185.11 |

* cited by examiner

*Primary Examiner*—Anh Phung
*Assistant Examiner*—Hien Nguyen
(74) *Attorney, Agent, or Firm*—Harness, Dickey & Pierce, P.L.C.

(57) ABSTRACT

Semiconductor devices, semiconductor memory device, or flash memories including a high voltage region including high voltage elements, a low voltage region including low voltage elements, and a switch transistor, such as a low voltage switch transistor, connecting the high voltage region and the high voltage region. The switch transistor reduces or eliminates coupling noise between sense nodes without increasing chip area.

39 Claims, 8 Drawing Sheets

SEMICONDUCTOR DEVICE FOR REDUCING COUPLING NOISE

PRIORITY STATEMENT

This application claims the benefit under 35 U.S.C. § 119(a) of Korean Patent Application No. 2004-020424, filed on Mar. 25, 2004, the contents of which are hereby incorporated by reference in their entirety.

BACKGROUND OF THE INVENTION

Recent developments in multimedia applications such as, cell phones, PDA, digital camera, etc. have increasingly required memory devices with higher density. Conventional memories include dynamic random access memory (DRAM), static random access memory (SRAM), and non-volatile memory (NVM). Non-volatile memory may include mask read only memory (ROM), electrically erasable programmable read only memory (EEPROM), and flash memory. Non-volatile memory does not lose data when power is lost, but is generally does not permit random access and is slower than volatile memory.

Flash memory may be formed by a combination of erasable programmable read only memory (EPROM) and electrically erasable programmable read only memory (EEPROM). Flash memory may be NAND or NOR flash memory. Erase and program operations may be performed in a flash memory by the application of different voltages to each flash memory cell.

Due to the increased demand for high density memory, flash memory, such as flash EEPROM, has been used in an auxiliary memory or in system programming applications where continuous updating is needed. Flash EEPROM also may have a higher integration degree than conventional EEPROM.

However, flash memory may have read errors due to coupling noise between sense lines of a page buffer. To reduce coupling noise and the resulting read errors, a space between sense nodes may be increased, or a signal line (for example, a VDD or a VSS line) may be inserted between sense lines. Both of these solutions have the drawback of requiring increased memory chip size and/or increased manufacturing costs.

Figure 1:
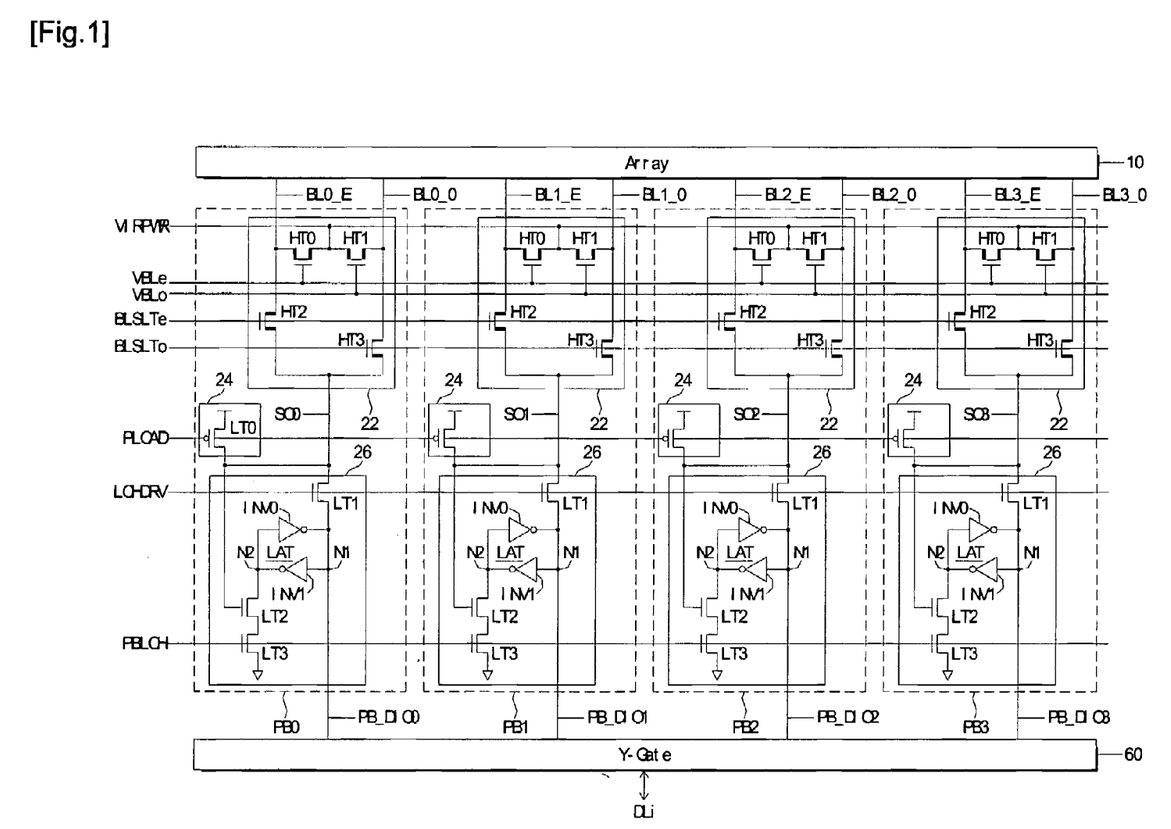
FIG. 1 illustrates a conventional flash memory device, such as a NAND-type flash memory device.

Referring to FIG. 1, a conventional flash memory device, such as a NAND-type flash memory device may include a memory cell array 10 for storing data. The memory cell array 10 may include a plurality of cell strings (which may be referred to as NAND strings) that are connected to corresponding bit lines. Each cell string may include a string select transistor connected to a corresponding bit line, a ground select transistor connected to a common source line, and memory cells connected serially between the string and ground select transistors.

FIG. 1 illustrates four pairs of bit lines (BL0_E, BL0_O), (BL1_E, BL1_O), (BL2_E, BL2_O) and (BL3_E, BL3_O), however, any number (usually many more than four) of bit lines may be connected to the memory cell array 10. Each bit line pair may be electrically connected to a corresponding page buffers PB0, PB1, PB2, and PB3.

Each of the page buffers PB0, PB1, PB2, and PB3 may act as a sense amplifier for a read/verify operation and as a driver for driving a bit line according to data to be programmed for a program operation. The page buffers PB0, PB1, PB2, and PB3 may be identical, therefore, constituent elements of the page buffers PB0, PB1, PB2, and PB3 are indicated by the same reference symbols, and the configuration of only one page buffer (e.g. PB0) need be described.

The page buffer PB0 may include a bit line select and bias circuit 22, a pre-charge circuit 24, and a sense and latch circuit 26. The bit line select and bias circuit 22 may include NMOS transistors HT0, HT1, HT2, and HT3. The NMOS transistor HT0 may be connected between a power line VIRPWR and a bit line BL0_E and controlled by a control signal VBLe. The NMOS transistor HT1 may be connected between the power line VIRPWR and a bit line BL0_O and controlled by a control signal VBLo. The NMOS transistor HT2 may be connected between the bit line BL0_E and a sense node SO0, and the NMOS transistor HT3 may be connected between the bit line BL0_O and the sense node SO0. The NMOS transistors HT2 and HT3 may be controlled by control signals BLSLTe and BLSLTo, respectively. Each of the NMOS transistors HT0-HT3 may be a high-voltage transistor having a breakdown voltage, for example, of about 28V.

The pre-charge circuit 24 may include a PMOS transistor LT0, which may be connected between a power supply voltage and the sense node SO0 (which may also be referred to as a sense line) and controlled by a control signal PLOAD.

The sense and latch circuit 26 may include NMOS transistors LT1, LT2, and LT3 and a latch LAT including inverters INV0 and INV1. The NMOS transistors LT2 and LT3 may be serially connected between a latch node N2 of the latch LAT and a ground voltage. A gate of the NMOS transistor LT2 may be electrically connected to the sense node SO0 and a gate of the NMOS transistor LT3 may be connected to receive a control signal PBLCH. The NMOS transistor LT1 may be electrically connected between the sense node SO0 and a latch node N1 of the latch LAT and controlled by a control signal LCHDRV. The latch node N1 may be used as a page buffer data input/output node PB_DIO0, which is connected to a column decoder 60. Each of the NMOS transistors LT0–LT3 and PMOS and the NMOS transistors that make up the inverters INV0 and INV1 may be a low-voltage transistor having a breakdown voltage, for example, of about 7V.

As describe above, higher-voltage transistors may be used in the bit line select and bias circuit 22 of each page buffer PB0, PB1, PB2, and PB3. This may be because a higher voltage (for example, about 20V) applied to a bulk region of the memory cell array 10 may be transferred to the bit lines (BL0_E, BL0_O), (BL1_E, BL1_O), (BL2_E, BL2_O) and (BL3_E, BL3_O), via source regions of the string select transistors of the memory array 10. For this reason, the NMOS transistors HT2 and HT3 in each page buffer PB0, PB1, PB2, and PB3 may be composed of higher-voltage transistors to prevent a higher voltage from being transferred to the corresponding pre-charge circuit 24 and sense and latch circuit 26.

Similarly, the NMOS transistors HT0 and HT1 in each page buffer PB0, PB1, PB2, and PB3 may be composed of higher-voltage transistors that can withstand higher voltages transferred to the corresponding bit lines (BL0_E, BL0_O), (BL1_E, BL1_O), (BL2_E, BL2_O) and (BL3_E, BL3_O), during an erase operation.

A high-voltage transistor may be formed to have a breakdown voltage of about 28V, while a low-voltage transistor may be formed in a P-type/N-type well to have a breakdown voltage of about 7V. Hereinafter, a region where higher-voltage transistors are formed will be referred to as a high-voltage region (or a high-voltage circuit region), and a region where lower-voltage transistors are formed will be referred to as a low-voltage region (or a low-voltage circuit region).

In each page buffer PB0, PB1, PB2, and PB3, NMOS transistors of a corresponding bit line select and bias circuit 22 may be formed in a high-voltage region and MOS transistors of a corresponding pre-charge circuit 24 and sense and latch circuit 26 may be formed in a low-voltage region.

Figure 2A:
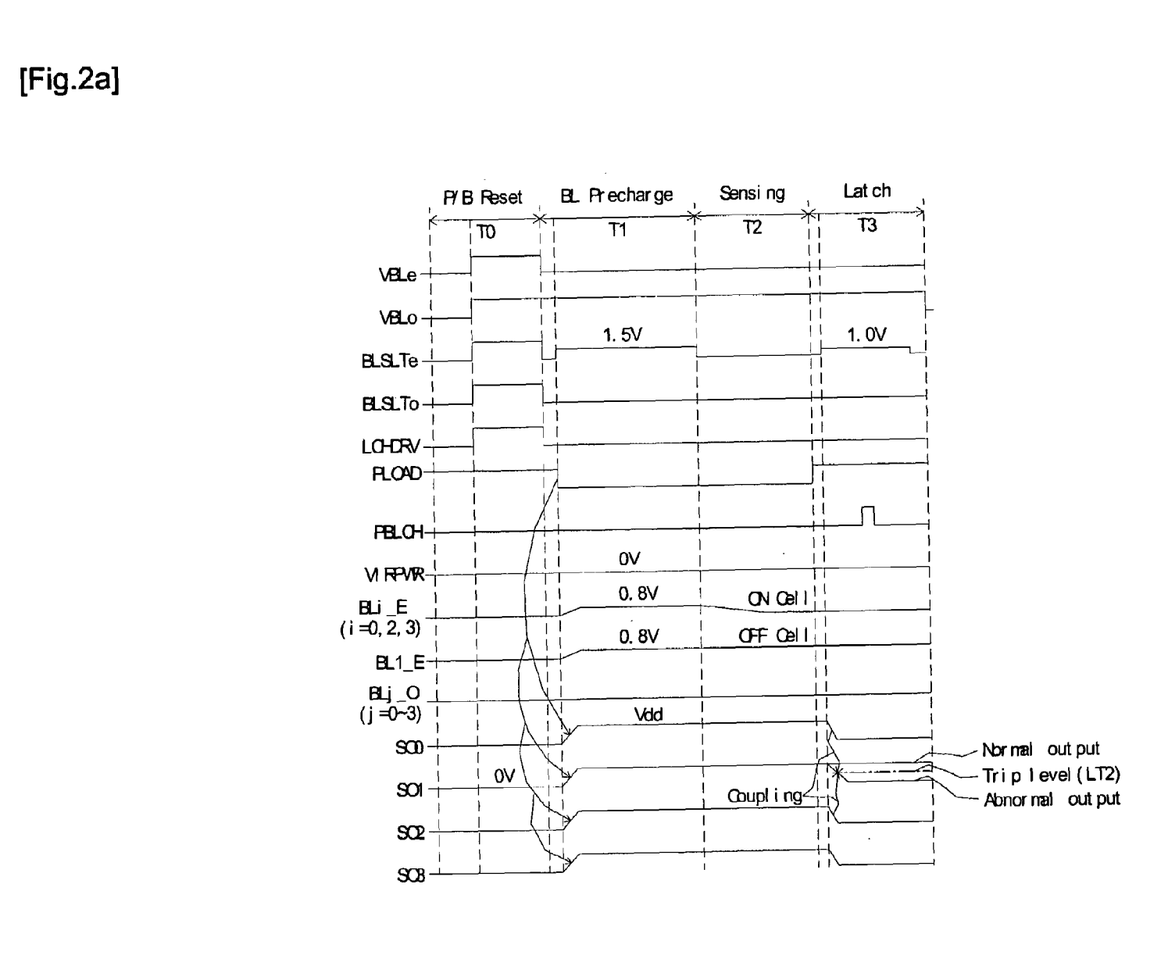
FIG. 2a illustrates a timing diagram for describing a read operation of the flash memory of FIG. 1.
Figure 2B:
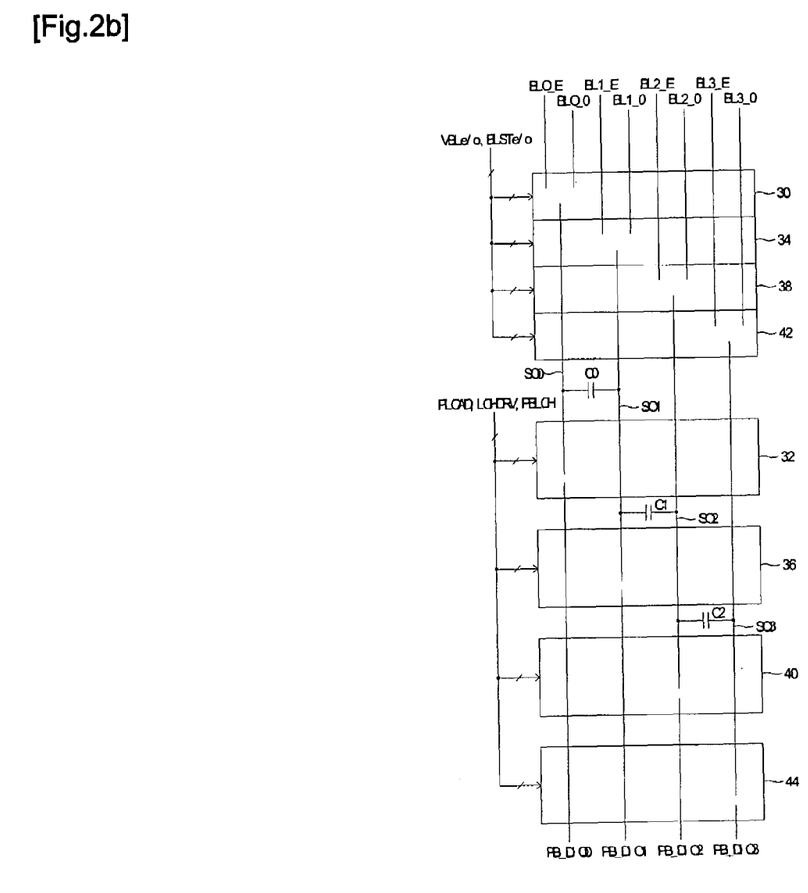
FIG. 2b illustrates an example layout of page buffers of a conventional flash memory device, such as the device of FIG. 1.

For example, referring to FIG. 2a, which illustrates a timing diagram for describing a read operation of the flash memory of FIG. 1 and FIG. 2b, which illustrates an example layout of the page buffers PB0, PB1, PB2, and PB3 of FIG. 1, constituent elements (i.e. high-voltage transistors) of the bit line select and bias circuit 22 in page buffer PB0 may be disposed in a high-voltage region 30, and constituent elements (i.e. low-voltage transistors) of the pre-charge circuit 24 and sense and latch circuit 26 in the page buffer PB0 may be disposed in a low-voltage region 32. Similarly, constituent elements (i.e. high-voltage transistors) of the bit line select and bias circuit 22 of page buffer PB1 may also be disposed in a high-voltage region 34 and constituent elements (i.e. low-voltage transistors) of the pre-charge circuit 24 and sense and latch circuit 26 of page buffer PB1 may be disposed in a low-voltage region 36. High-voltage transistors of other page buffers, for example, PB2, PB3, etc. may also be disposed in corresponding high-voltage regions 38, 42, etc. and low-voltage transistors of the other page buffers may also be disposed in corresponding low-voltage regions 40, 44, etc.

As illustrated in FIG. 2b, the high-voltage regions 30, 34, 38, and 42 may be collectively arranged closer to the bit lines (BL0_E, BL0_O), (BL1_E, BL1_O), (BL2_E, BL2_O) and (BL3_E, BL3_O) and the low-voltage regions 32, 36, 40, 44 may be collectively arranged further away from the bit lines (BL0_E, BL0_O), (BL1_E, BL1_O), (BL2_E, BL2_O) and (BL3_E, BL3_O). An advantage of such an arrangement is that it enables repetition of a well space between the high-voltage region and the low-voltage region to be reduced. If an arrangement such as the one illustrated in FIG. 2b is not utilized, a well space between a high-voltage region and a low-voltage region must be repeated, thus increasing layout size.

However, using the page buffer layout of FIG. 2b, for sense nodes of page buffers PB0, PB1, PB2, and PB3, sense lines SO0, SO1, SO2, and SO3 may be extended from the high-voltage regions 30, 34, 38, and 42 into the low-voltage regions 32, 36, 40, 44. This layout may cause a read error, which is more clearly illustrated in FIG. 2a.

As described above, FIG. 2a illustrates a timing diagram for a read operation of a flash memory device, such as the device of FIG. 1. As shown, a read operation of a flash memory device may include a page buffer reset interval T0, a bit line pre-charge interval T1, a sense interval T2, and a latch interval T3. Each interval is described in more detail below.

In the page buffer reset interval T0, control signals VBLe, VBLo, BLSLTe, BLSLTo, LCHDRV, and PLOAD may be set to a first level (for example, a "high" level) and a ground voltage may be supplied to a power line VIRPWR. This makes bit lines BLi_E and BLi_O (i=0–3) and latch nodes N1 connected to the power line VIRPWR. The bit lines BLi_E and BLi_O and the latch nodes N1 may be set to the ground voltage; that is, the bit lines BLi_E and BLi_O and the latch nodes N1 may be reset in the page buffer reset interval T0.

Assuming that the even-numbered bit lines BLi_E of the bit lines pairs are selected and the odd-numbered bit lines BLi_O thereof are unselected, in the bit line pre-charge interval T1, the control signals VBLe, BLSLTo, LCHDRV, and PLOAD may be set to a second level (for example, a "low" level), while the control signal VBLo continues to be maintained at the first level (high). The control signal BLSLTe may be set to have a voltage of about 1.5V.

Under these conditions, the unselected bit lines BLi_O may be electrically connected to the power line VIRPWR through NMOS transistors HT1 of corresponding bit line select and bias circuits 22. That is, discharged voltages on the unselected bit lines BLi_O may be maintained.

At the same time, as PMOS transistors LT0 of page buffers PB0–PB3 may be turned on and the sense nodes SO0–SO3 may be charged with a power supply voltage. Since the control signal BLSLTe having a voltage of about 1.5V is applied to the gates of NMOS transistors HT2 of the page buffers PB0–PB3, selected bit lines BLi_E are pre-charged with a voltage of (1.5V-Vth) (where Vth is a threshold voltage of an NMOS transistor). For example, the selected bit lines BLi_E may be pre-charged with about 0.8V.

In the sense interval T2, the control signals VBLe, VBLo, BLSLTo, LCHDRV, and PLOAD may be maintained at the same conditions as in the bit line pre-charge interval T1, while the control signal BLSLTe is set to a second (low) level. This turn off NMOS transistors HT2 of the page buffers PB0–PB3. In this state, pre-charged voltages on the selected bit lines BLi_E may be maintained or lowered according to a state (an "on" state or an "off" state) of memory cells connected to the selected bit lines BLi_E. Assuming that memory cells of an on state are connected to the selected bit lines BL0_E, BL2_E, and BL3_E and a memory cell of an off state is connected to the selected bit line BL1_E, as illustrated in FIG. 2a, the pre-charged voltages on the bit lines BL0_E, BL2_E, and BL3_E may be lowered to a ground voltage while the pre-charged voltage on the bit line BL1_E may be maintained.

As the control signal PLOAD is set to a first (high) level in the latch interval T3, PMOS transistors LT0 of the page buffers PB0–PB3 may be turned off, so that the sense nodes SO0, SO1, SO2, and SO3 "float". In this condition, a voltage of about 1.0V is applied to the control signal BLSLTe. Because the pre-charged voltage on the bit line BL1_E is maintained, an NMOS transistor HT2 of the page buffer PB1 is shut off. This is because a gate-source voltage Vgs (Vgs=1.0V−0.8V=0.2V) of the NMOS transistor HT2 in the page buffer PB1 is lower than a threshold voltage (0.7V). On the other hand, since the pre-charged voltages on the bit lines BL0_E, BL2_E, and BL3_E are discharged through memory cells of an on state, NMOS transistors HT2 of the other page buffers PB0, PB2, and PB3 are turned on. Voltages on sense nodes SO0, SO2, and SO3 may be discharged from the power supply voltage to the ground voltage, while a voltage on the sense node SO1 is maintained.

This forces an NMOS transistor LT2 connected to the sense node SO1 to be turned on and NMOS transistors LT2 connected to the sense nodes SO0, SO2, and SO3 to be turned off. Afterward, as illustrated in FIG. 2a, when the control signal PBLCH is pulsed, values of latches LT in the page buffers PB0–PB3 are determined according to voltages on the sense nodes SO0–SO3.

As described above, voltages on the sense nodes SO0–SO3 may be selectively changed from a power supply voltage to a ground voltage at a floating state. A sense node in a floating state may be affected by voltage variations of an adjacent sense node through, for example, coupling capacitance.

As illustrated in FIG. 2b, because adjacent sense nodes (or sense lines) may be laid out to overlap in a direction vertical to a bit line, coupling capacitance (in FIG. 2b, C0–C3) may exist between adjacent sense lines.

When a voltage on a sense node SO1 of a floating state is lowered by a corresponding voltage to a coupling ratio (α) of a coupling capacitance when voltages on adjacent sense nodes SO0 and SO2 are changed from a power supply voltage to a ground voltage. This may be referred to as coupling noise or sense noise.

If a voltage on the sense node SO1 of a floating state becomes lower than a trip voltage of an NMOS transistor LT2 due to the coupling noise, erroneous data may be latched in a latch LAT when the control signal PBLCH is pulsed. As a result, with a page buffer layout arrangement as shown in FIG. 2, a read error may be caused by the coupling noise between adjacent sense lines (or nodes).

SUMMARY OF THE INVENTION

Example embodiments of the present invention are directed to semiconductor devices, such as semiconductor memory devices, including, for example, flash memory, with reduced or eliminated coupling noise between sense nodes without increasing chip area.

Example embodiments of the present invention are directed to semiconductor devices, semiconductor memory device, or flash memories including a high voltage region including high voltage elements, a low voltage region including low voltage elements, and a switch transistor, such as a low voltage switch transistor, connecting the high voltage region and the high voltage region.

In example embodiments of the present invention, in the high voltage region, adjacent sense lines do not overlap in an orthogonal direction to bit lines in the high voltage region.

In example embodiments of the present invention, in the high voltage region, adjacent sense lines are sufficiently spaced apart from each other.

In example embodiments of the present invention, in the high voltage region, adjacent sense lines do not overlap.

In example embodiments of the present invention, in the high voltage region, adjacent sense lines, do not face each other.

In example embodiments of the present invention, in the high voltage region, adjacent sense lines are stepwise or diagonally arranged in an orthogonal direction to a bit line.

In example embodiments of the present invention, the low voltage region includes sense lines and the high voltage region does not.

Example embodiments of the present invention are directed to semiconductor devices, semiconductor memory device, flash memories including a plurality of page buffers, a page buffer or buffers of a flash memory, or a circuit for a flash memory. Each page buffer may include a bit line select and bias circuit, a sense and latch circuit and the switch transistor, such as a low voltage switch transistor.

BRIEF DESCRIPTION OF THE DRAWINGS

The present invention will become more fully understood from the detailed description given below and the accompanying drawings, which are given for purposes of illustration only, and thus do not limit the invention.

It should be noted that these Figures are intended to illustrate the general characteristics of methods and devices of exemplary embodiments of this invention, for the purpose of the description of such exemplary embodiments herein. These drawings are not, however, to scale and may not precisely reflect the characteristics of any given embodiment, and should not be interpreted as defining or limiting the range of values or properties of exemplary embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

DETAILED DESCRIPTION OF EXEMPLARY EMBODIMENTS OF THE PRESENT INVENTION

Figure 3:
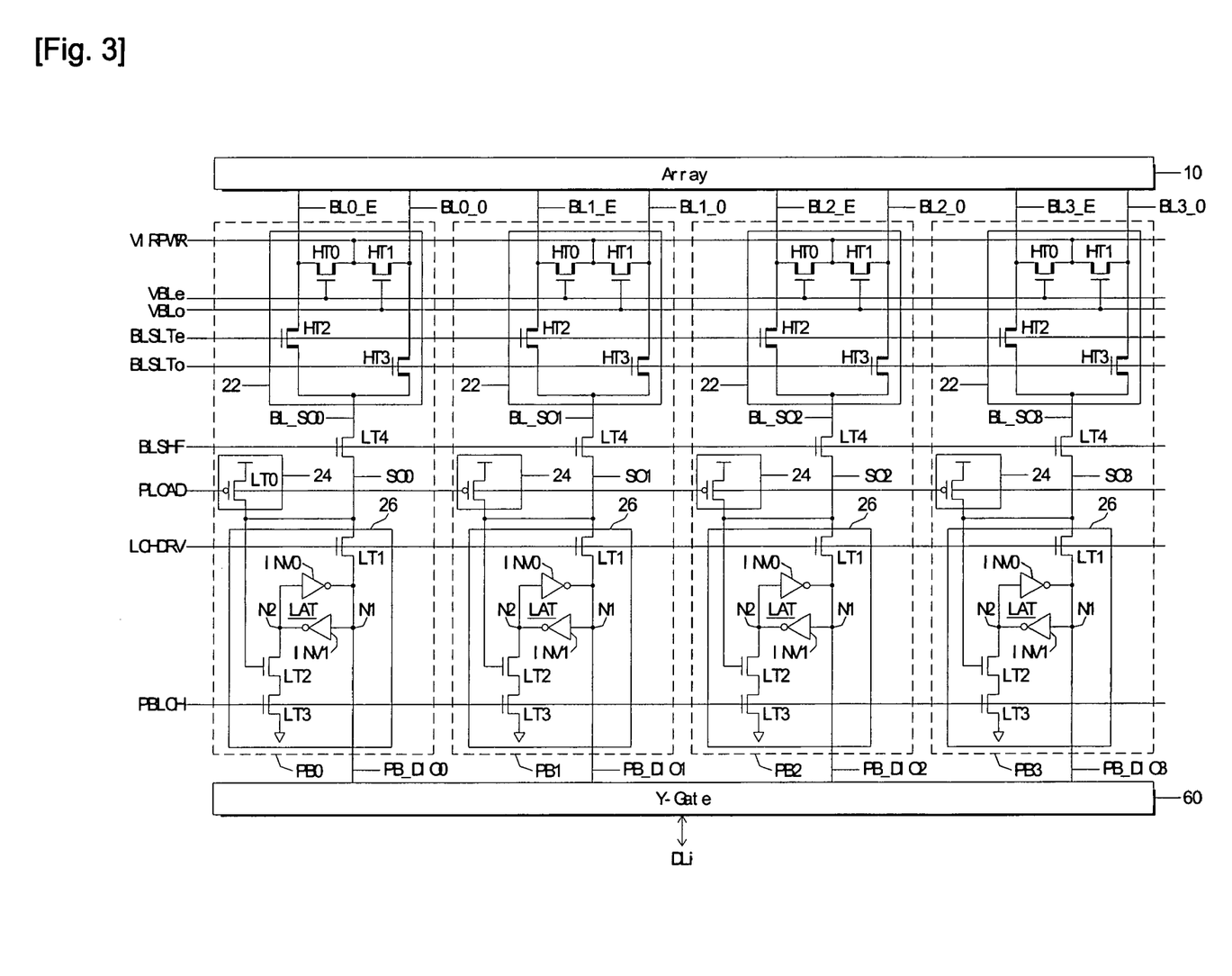
FIG. 3 illustrates a page buffer of a flash memory device according to an example embodiment of the present invention.

FIG. 3 illustrates a page buffer of a flash memory device according to an example embodiment of the present invention. As shown in FIG. 3, one more of the page buffers PB0, PB1, PB2, and PB3 of the present invention may include a switch transistor LT4. In FIG. 3, constituent elements that are identical to those in FIG. 1 are marked by the same reference numerals, and description thereof is thus omitted.

The switch transistor LT4 of each of page buffers PB0, PB1, PB2, and PB3 may be a low-voltage transistor, which is formed within a low-voltage region (or a low-voltage circuit region) where a pre-charge circuit 24 and a sense and latch circuit 26 of each page buffer PB0, PB1, PB2, and PB3 are formed. In each page buffer, a drain of the switch transistor LT4 may be electrically connected to a gate of an NMOS transistor LT2 as a sense transistor through a corresponding sense line SOi (i=0–3). A source of the switch transistor LT4 may be electrically connected to NMOS transistors HT2 and HT3 through a corresponding bit line-to-sense line segment BL_SOi. The switch transistors LT4 of the page buffers PB0, PB1, PB2, and PB3 may be commonly controlled by a control signal BLSHF.

In a flash memory device according to an example embodiment of the present invention, during a read operation, a power supply voltage is applied to a gate of the NMOS transistor (HT2 or HT3) connected to a selected bit line, and different voltages are applied to a gate of the switch transistor LT4 during different intervals of the read operation.

In an example embodiment, during the read operation, the switch transistor LT4 may acts as the NMOS transistor (HT2 or HT3) described above in conjunction with FIG. 1, which means that a bit line-to-sense line segment BL_SOi may be used as a part of a selected bit line, not as a part of a sense line. Unlike FIG. 2b, there is little or no coupling capacitance (shown in FIG. 2b as C0–C2) which may cause coupling noise between sense lines adjacent in an orthogonal direction to the bit line.

With this layout arrangement, because adjacent sense lines are sufficiently spaced apart from each other, so as not to be overlap, for example, so as not to "face" each other (or be otherwise stepwise or diagonally arranged) in an orthogonal direction to a bit line, a sense line of a floating state is not affected by a voltage variation (from a power supply voltage to a ground voltage or vice versa) of adjacent sense lines.

Figure 4A:
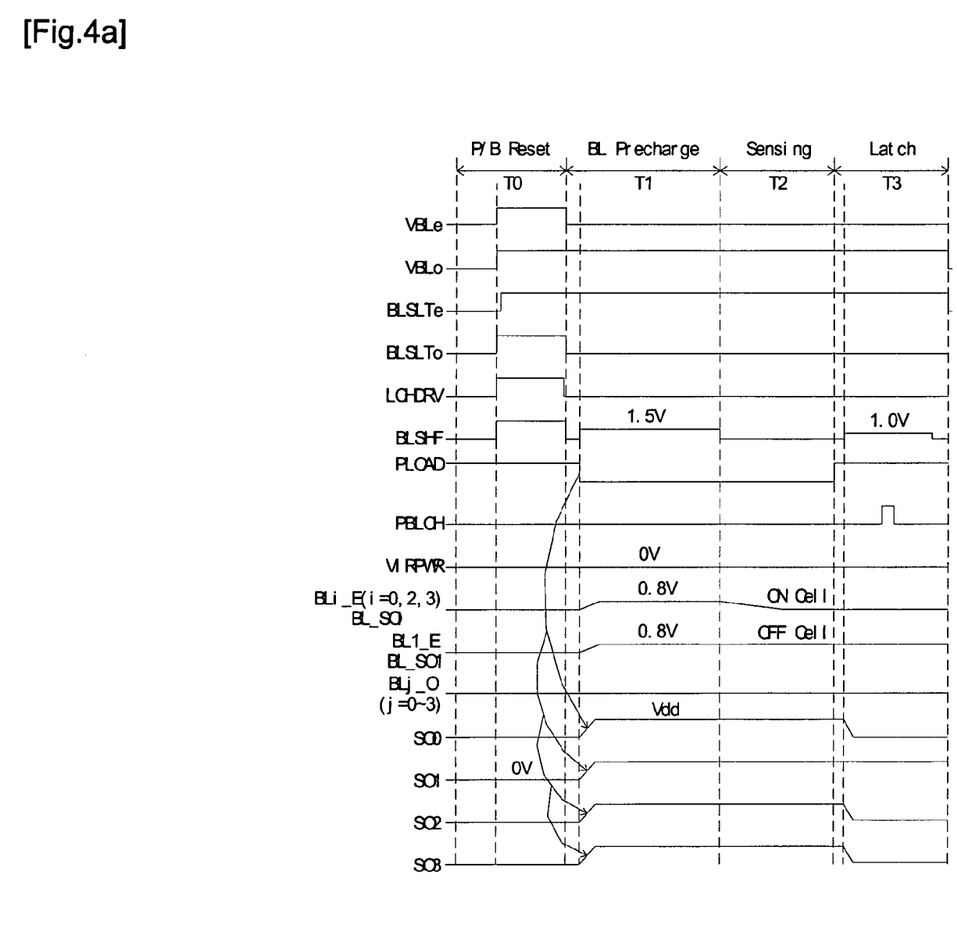
FIG. 4a illustrates a timing diagram for describing a read operation of a flash memory device, according to an example embodiment of the present invention.
Figure 4B:
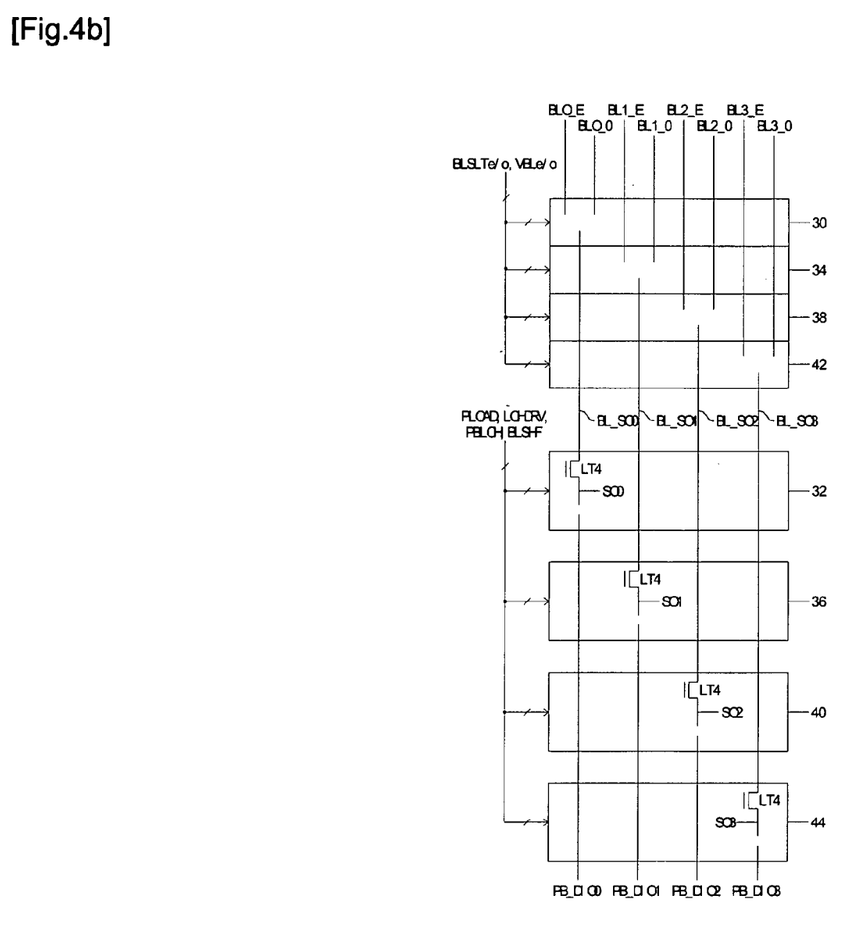
FIG. 4b illustrates an example layout of page buffers of a flash memory device, according to an example embodiment of the present invention.

FIG. 4a illustrates a timing diagram for describing a read operation of the flash memory of FIG. 3 and FIG. 4b illustrates an example layout structure of page buffers of a flash memory device, according to an example embodiment of the present invention. Reference numerals 30, 34, 38, 42 indicate high-voltage regions (or high-voltage circuit regions) and reference numerals 32, 36, 40, and 44 indicate low-voltage regions (or low-voltage circuit regions). In the page buffers PB0, PB1, PB2, and PB3, NMOS transistors in a bit line select and bias circuit 22 may be formed in a high-voltage region, and a switch transistor LT4, MOS transistors of a pre-charge circuit 24, and a sense and latch circuit 26 may be formed in a low-voltage region.

For example, referring to FIG. 4b, constituent elements (i.e. high-voltage transistors) of a bit line select and bias circuit 22 of the page buffer PB0 may be disposed in a high-voltage region 30 and a switch transistor LT4 and constituent elements (i.e. low-voltage transistors) of pre-charge circuit 24 and sense and latch circuit 26 may be disposed in a low-voltage region 32. Constituent elements (i.e. high-voltage transistors) of a bit line select and bias circuit 22 of the page buffer PB1 may be disposed within a high-voltage region 34 and a switch transistor LT4 and constituent elements (i.e. low-voltage transistors) of pre-charge circuit 24 and sense and latch circuit 26 may be disposed in a low-voltage region 36. High-voltage transistors of other page buffers may also be disposed in corresponding high-voltage regions 38 and 42 and low-voltage transistors (including a switch transistor LT4) of the other page buffers may be disposed in corresponding low-voltage regions 40 and 44.

Although not shown in FIGS. 3, 4a, and 4b, each of the low-voltage regions may include a P-type well and an N-type well. Low-voltage NMOS transistors (e.g. LT1, LT2, LT3, LT4, and NMOS transistors of inverters INV0 and INV1) may be formed within the P-type well and low-voltage transistors (e.g. LT0 and PMOS transistors of inverters INV0 and INV1) may be formed within the N-type well.

The high-voltage regions 30, 34, 38, and 42 may be collectively arranged in a region closer to the bit lines and in a column, and the low-voltage regions 32, 36, 40, and 44 may be collectively arranged at a region further from the bit lines and in a column. The high-voltage regions and the low-voltage regions may be disposed collectively in the same general location for the same purpose, as described above.

As illustrated in FIG. 4b, sense lines SO0, SO1, SO2, and SO3 may be locally laid out only within a corresponding low-voltage regions. In particular, the sense lines SO0–SO3 may be locally laid out within corresponding low-voltage regions, so as not to be overlap (so as not to "face" each other) in an orthogonal direction to a bit line. In other words, the sense lines SO0–SO3 may be stepwise or diagonally laid out within corresponding low-voltage regions so as not to overlap in an orthogonal direction to a bit line.

The sense lines SO0–SO3 may be laid out locally within corresponding low-voltage regions so as to have the same or substantially the same length as one another or so as to have a different lengths from one another. Accordingly, unlike that illustrated in FIG. 2b, there exists little or no coupling capacitance (in FIG. 2b, C0–C2) which causes coupling noise between sense lines adjacent in an orthogonal direction to a bit line.

With this layout arrangement, since adjacent sense lines are sufficiently spaced apart from each other, any sense line in a floating state is not affected by a voltage variation (from a power supply voltage to a ground voltage or vice versa) of adjacent sense lines.

As described above, although voltages on sense nodes (or lines) SO0–SO3 may be selectively changed from a power supply voltage to a ground voltage at a floating state during a sense interval, a sense node of a floating state is not affected by voltage variations of adjacent sense nodes.

As mentioned above, FIG. 4a illustrates a timing diagram for a read operation of a flash memory device, according to an example embodiment of the present invention, which is described below in more detail.

In the page buffer reset interval T0, control signals VBLe, VBLo, BLSLTe, BLSLTo, LCHDRV, PLOAD, and BLSHF transition to a first level (for example a "high" level) and a ground voltage is supplied to a power line VIRPWR. This connects bit lines BLi_E and BLi_O (i=0–3) and latch nodes N1 to the power line VIRPWR. The bit lines BLi_E and BLi_O and the latch nodes N1 may be set to the ground voltage, that is, the bit lines BLi_E and BLi_O and the latch nodes N1 may be reset in the page buffer reset interval T0. It is assumed that the even-numbered bit lines BLi_E of bit lines pairs are selected and odd-numbered bit lines BLi_O thereof are unselected.

In the bit line pre-charge interval T1, the control signals VBLe, BLSLTo, LCHDRV, and PLOAD may be set to a second level (for example a "low" level), while the control signals VBLo and BLSLTe continue to be maintained at a first (high) level. At this time, as shown in FIG. 4a, the control signal BLSHF may be set to have a voltage of about 1.5V. With these conditions, unselected bit lines BLi_O may be electrically connected to the power line VIRPWR through NMOS transistors HT1 of a corresponding bit line select and bias circuits 22; that is, discharged voltages on the unselected bit lines BLi_O are maintained.

At the same time, as PMOS transistors LT0 of page buffers PB0, PB1, PB2, and PB3 are turned on, the sense nodes SO0–SO3 are charged with a power supply voltage. Since the control signal BLSLTe of a high level is applied to gates of NMOS transistors HT2 of the page buffers PB0, PB1, PB2, and PB3, the NMOS transistors HT2 are turned on sufficiently to pre-charge the bit lines. Because the control signal BLSHF having a voltage of about 1.5V is applied to the gates of the NMOS transistors LT4, selected bit lines BLi_E are pre-charged with a voltage of (1.5V-Vth)

(where Vth is a threshold voltage of an NMOS transistor); that is, the selected bit lines BLi_E are pre-charged with about 0.8V.

In the sense interval T2, the control signals VBLe, VBLo, BLSLTe, BLSLTo, LCHDRV, and PLOAD may be maintained at the same conditions as the bit line pre-charge interval T1, while the control signal BLSHF is set to a low level of a ground voltage. This turns off the NMOS transistors LT4 of the page buffers PB0–PB3. At this state, pre-charged voltages on the selected bit lines BLi_E may be maintained or lowered according to a state (an "on" state or an "off" state) of memory cells connected to the selected bit lines BLi_E. Assuming that memory cells of an on state are connected to the selected bit lines BL0_E, BL2_E, and BL3_E and a memory cell of an off state is connected to the selected bit line BL1_E, as illustrated in FIG. 4a, the pre-charged voltages on the bit lines BL0_E, BL2_E, and BL3_E may be lowered to a ground voltage while the pre-charged voltage on the bit line BL1_E is maintained.

As the control signal PLOAD is set to a first (high) level in the latch interval T3, PMOS transistors LT0 of the page buffers PB0–PB3 may be turned off, so that the sense nodes SO0, SO1, SO2, and SO3 are floating. In this condition, a voltage of about 1.0V may be applied to the control signal BLSHF. Because the pre-charged voltage on the bit line BLi_E is maintained, an NMOS transistor LT4 of the page buffer PB1 may be shut off. This is because a gate-source voltage Vgs (Vgs=1.0V–0.8V=0.2V) of the NMOS transistor LT4 in the page buffer PB1 is lower than a threshold voltage (0.7V).

On the other hand, since the pre-charged voltages on the bit lines BL0_E, BL2_E, and BL3_E are discharged through memory cells of an on state, NMOS transistors LT4 of other page buffers PB0, PB2, and PB3 are turned on. As illustrated in FIG. 4a, voltages on sense nodes SO0, SO2, and SO3 are discharged from the power supply voltage to the ground voltage, while a voltage on the sense node SO1 is maintained. This forces an NMOS transistor LT2 connected to the sense node SO1 to be turned on and NMOS transistors LT2 connected to the sense nodes SO0, SO2, and SO3 to be turned off. Afterward, as illustrated in FIG. 4a, when the control signal PBLCH is pulsed, values of latches LAT in the page buffers PB0, PB1, PB2, and PB3 may be determined according to voltages on the sense nodes SO0–SO3.

As described above, although voltages on sense nodes (or lines) SO0–SO3 are selectively changed from a power supply voltage to a ground voltage at a floating state during a sense interval, a sense node in a floating state is not affected by voltage variation of adjacent sense nodes (or lines).

As illustrated in FIG. 4b, because adjacent sense lines (or nodes) are laid out so as not to overlap (or so as not to "face" each other) in a direction vertical to a bit line, little or no coupling capacitance (in FIG. 2b, C0–C2) exists between adjacent sense lines (or nodes). Accordingly, a read error is not caused by coupling noise.

Although in the example embodiments of FIG. 3 of the present invention, a layout structure of page buffers connected to four bit line pairs is illustrated in FIGS. 4a and 4b, it is obvious that the same circuit pattern as illustrated in FIGS. 4a and 4b may be repeated.

Also, the control signal BLSHF applied to the gates of the switch transistors LT4 may be set to a power supply voltage or a ground voltage at an erase operation. During program operation, the control signal BLSHF may be set to the same or higher voltage than a power supply voltage so that a power supply voltage or a ground voltage is supplied to a bit line according to data stored in a latch. Also, during a verify operation, the control signal BLSHF may be set the same as the read operation. As a result, a sense and latch circuit of each page buffer 26 can be easily modified.

Figure 5:
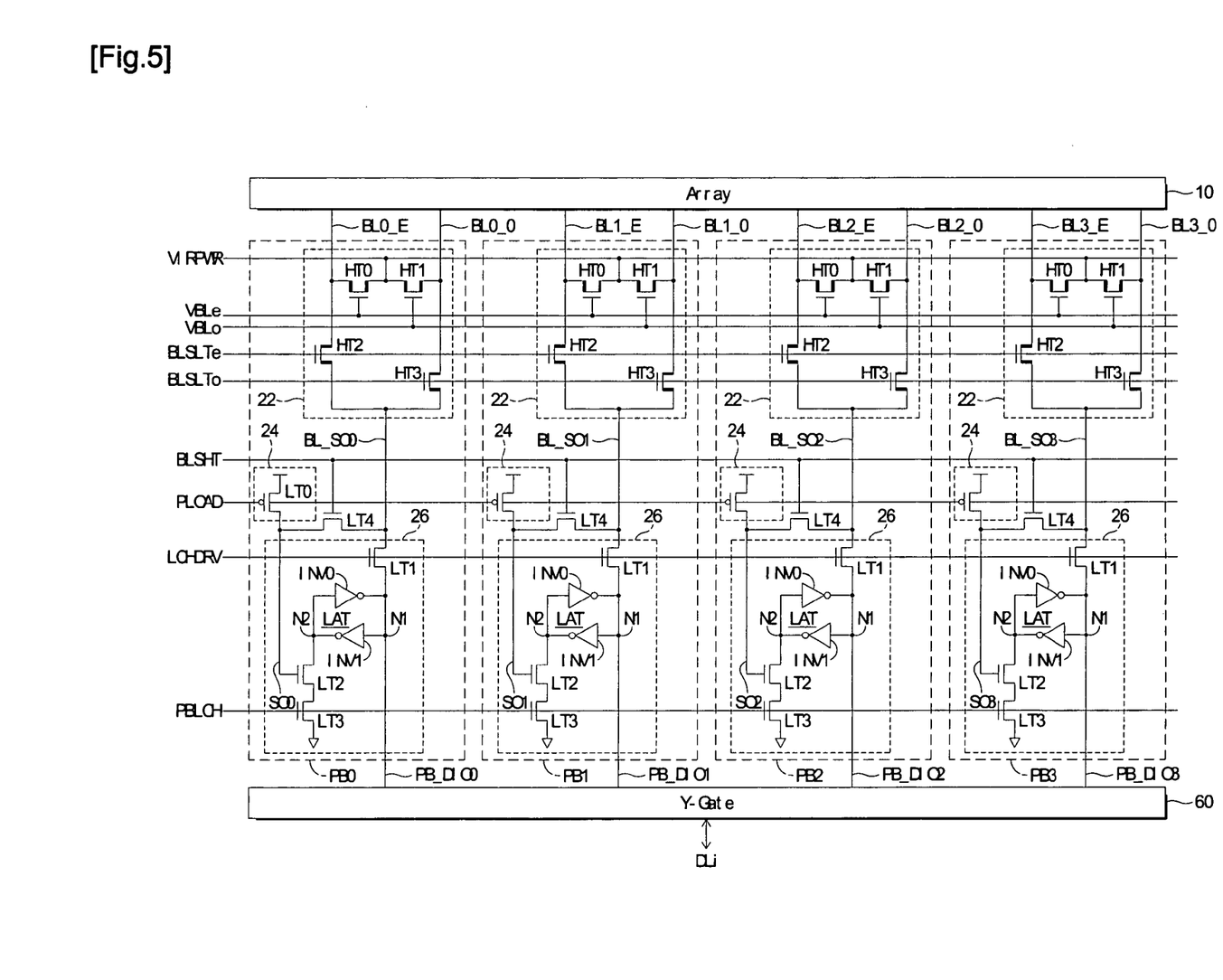
FIG. 5 illustrates a page buffer of a flash memory device according to another example embodiment of the present invention.

For example, referring to FIG. 5, an NMOS transistor LT1 of a latch and sense circuit 26 in each page buffer can be realized so as to be connected not to a sense line SOi (i=0–3), but to a bit line-to-sense line BL_SOi. In this example, a sense line of each page buffer PB0, PB1, PB2, and PB3 may be laid out within a corresponding low-voltage region (or a low-voltage circuit region), so that adjacent sense lines are disposed so as not to overlap (or so as not to "face" each other) in an orthogonal direction to a bit line.

Figure 6A:
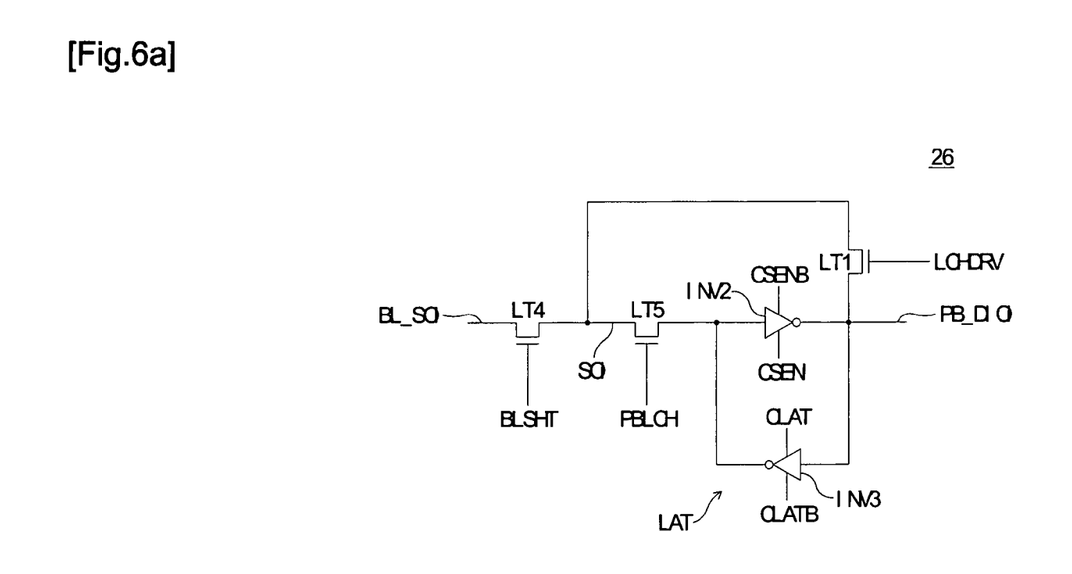
FIG. 6a illustrates a sense and latch circuit according to an example embodiment of the present invention.
Figure 6B:
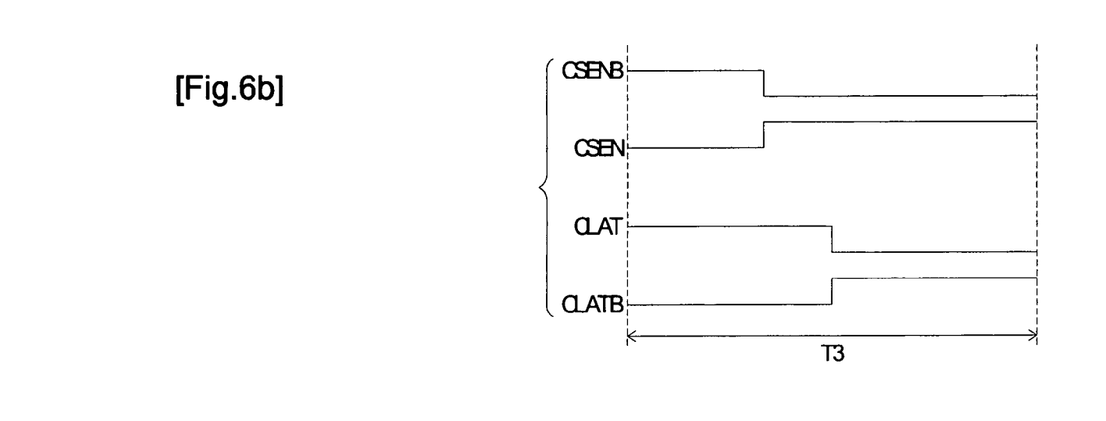
FIG. 6b illustrates a timing diagram for sense and latch circuit of FIG. 6a, according to an example embodiment of the present invention.

Furthermore, referring to FIGS. 6a and 6b, the sense and latch circuit 26 may be realized such that a voltage on a sense node SOi may be transferred to a latch LAT via an NMOS transistor LT5. In this case, the latch LAT may be controlled by control signals CSEN, CSENB, CLAT, and CLATB to latch a voltage (or data) transferred via the transistor LT5. To achieve this, as illustrated in FIG. 6a, an inverter INV2 may be activated by the control signals CSEN and CSENB and then an inverter INV3 may be activated by the control signals CLAT and CLATB.

Exemplary embodiments of the present invention may be semiconductor devices.

Exemplary embodiments of the present invention may be non-volatile memory.

Exemplary embodiments of the present invention may be flash memory.

Exemplary embodiments of the present invention may be NAND or NOR flash memory.

Although exemplary embodiments of the present invention have been described with four pair of bit lines and four page buffers, it will be understood by one of ordinary skill in the art that any other number may be utilized, without departing from the scope and spirit of the invention.

Although exemplary embodiments of the present invention have been described with a switch transistor, it will be understood by one of ordinary skill in the art that any other circuit implementation may be used, without departing from the scope and spirit of the invention.

Although exemplary embodiments of the present invention have been described with respect to example voltages, it will be understood by one of ordinary skill in the art that each of these voltages may be varied, without departing from the scope and spirit of the invention. For example, the voltage which defines a high-voltage region or a high-voltage transistor may be any voltage as long as the voltage which defines a high-voltage region or a high-voltage transistor is greater than a voltage which defines a low-voltage region or a low-voltage transistor.

Although exemplary embodiments of the present invention have been described as using a logic states 'low' and 'high', it will be understood by one of ordinary skill in the art that these logic states are interchangeable, without departing from the scope and spirit of the invention.

Although exemplary embodiments of the present invention have been described as including NMOS and PMOS transistors, it will be understood by one of ordinary skill in the art that any other circuit implementation may be used, without departing from the scope and spirit of the invention.

It will be apparent to those skilled in the art that other changes and modifications may be made in the above-described exemplary embodiments without departing from the scope of the invention herein, and it is intended that all matter contained in the above description shall be interpreted in an illustrative and not a limiting sense.

I claim:

1. A flash memory, comprising:
a first page buffer including a first pair of bit lines; and
a second page buffer including a second pair of bit lines;
each of the first and second page buffers including
a high voltage circuit for selecting one of the pair of bit lines,
a low voltage circuit for sensing cell data via the bit line, and
a switch transistor connected to a sense line, where the sense lines of the first and second page buffers are step-wise arranged so as to not overlap in an orthogonal direction to the bit lines.

2. The flash memory of claim 1, each low voltage circuit further including a latch for latching data and a sense transistor.

3. The flash memory of claim 1, wherein each high voltage circuit is positioned closer to the corresponding pair of bit lines than each low voltage circuit.

4. The flash memory of claim 2, wherein each low voltage circuit is positioned in a low voltage region, the low voltage region including first and second well regions arranged in a column.

5. The flash memory of claim 4, wherein the sense line of the first page buffer is located in the first well region and the sense line of the second page buffer is located in the second well region.

6. The flash memory of claim 5, wherein the first well region includes a first P-type well and a first N-type well where transistors of the low voltage circuit of the first page buffer are formed and the second well region includes a second P-type well and a second N-type well where transistors of the low voltage circuit of the second page buffer are formed.

7. The flash memory of claim 1, wherein the switch transistor of the first and second page buffers is a low voltage switch transistor.

8. The flash memory of claim 7, wherein the switch transistor of the first and second page buffers has a current path between the high voltage circuit and the sense line and a control signal is supplied to a gate of the switch transistor.

9. The flash memory of claim 7, wherein the control signal has different voltages for a bit line pre-charge interval, a sense interval, and a latch interval.

10. The flash memory of claim 1, wherein each low voltage circuit includes a pre-charge transistor controlled by a control signal.

11. A flash memory, comprising:
a plurality of page buffers, each including a pair of bit lines, each page buffer including,
a bit line select and bias circuit, including high voltage transistors for selecting one of the pair of bit lines,
a sense and latch circuit, including low voltage transistors for sensing cell data via the bit line, and
a low voltage switch transistor, connecting at least one of the high voltage transistors and at least one of the low voltage transistors, and connected to a sense line,
where the sense lines of adjacent page buffers are step-wise arranged so as to not overlap in a direction orthogonal to a direction of each pair of bit lines.

12. The flash memory of claim 11, wherein each sense and latch circuit and low voltage switch transistor is positioned in a low voltage region, the low voltage region including first and second well regions arranged in a column.

13. The flash memory of claim 11, wherein the sense line of the first of the plurality of page buffers is located in the first well region and the sense line of the second of the plurality of page buffers is located in the second well region.

14. The flash memory of claim 13, wherein the first well region includes a first P-type well and a first N-type well where the low voltage transistors of the sense and latch circuit of the first page buffer are formed and the second well region includes a second P-type well and a second N-type well where the low voltage transistors of the sense and latch circuit of the second page buffer are formed.

15. The flash memory of claim 11, each sense and latch circuit including a latch for latching data and a sense transistor.

16. A flash memory, comprising:
a first page buffer including a first pair of bit lines; and
a second page buffer including a second pair of bit lines;
each of the first and second page buffers including
a first high voltage bit line select transistor circuit connected to a first bit line to sense line segment,
a second high voltage bit line select transistor circuit connected to a second bit line to sense line segment, and
a low voltage switch transistor connected to a sense line,
wherein the first bit line to sense line segment and the second bit line to sense line segment are connected to the corresponding low voltage switch transistor;
wherein the sense lines of adjacent page buffers are arranged so as to not overlap in a direction orthogonal to a direction of each pair of bit lines.

17. The flash memory of claim 16, wherein each first high voltage bit line select transistor circuit and each second high voltage bit line select transistor circuit is positioned closer to the corresponding pair of bit lines than each low voltage switch transistor.

18. The flash memory of claim 16, wherein each low voltage switch transistor is positioned in a low voltage region, the low voltage region including first and second well regions arranged in a column.

19. The flash memory of claim 18, wherein the sense line of the first page buffer is located in the first well region and the sense line of the second page buffer is located in the second well region.

20. The flash memory of claim 19, wherein the first well region includes a first P-type well and a first N-type well where the low voltage switch transistor of the first page buffer is formed and the second well region includes a second P-type well and a second N-type well where the low voltage switch transistor of the second page buffer is formed.

21. The flash memory of claim 16, wherein each of the first and second page buffers includes a low voltage pre-charge transistor for precharging a sense node.

22. The flash memory of claim 16, wherein each of the first and second page buffers includes a low voltage drive transistor corresponding to a bit line to sense line segment.

23. The flash memory of claim 16, wherein each of the first and second page buffers includes a low voltage drive transistor corresponding to a sense line.

24. A semiconductor device, comprising:
a memory cell array including a plurality of cell strings each electrically connected to corresponding bit lines, wherein among the corresponding bit lines, two adjacent bit lines constitute a bit line pair;
a first page buffer connected to a first bit line pair;
a second page buffer connected to a second bit line pair;
each of the first and second page buffers including
a bit line select and bias circuit for selecting one bit line of a corresponding bit line pair to couple the selected bit line to a sense line, the bit line select and bias circuit including high voltage elements located in a high voltage region, a sense and latch circuit coupled to the bit line pair, for sensing cell data via the bit line pair, the sense and latch circuit including low voltage elements located in a low voltage region, and a switch transistor, connecting the bit line select and bias circuit and the sense and latch circuit, and connected to a sense line, where adjacent sense lines of the first and second page buffers are step-wise arranged so as to not overlap in a direction orthogonal to the bit lines; and a column gate circuit for selecting at least one of the first and second page buffers to couple the selected page buffer to a data bus.

25. The semiconductor device of claim 24, wherein the semiconductor device is a flash memory.

26. A flash memory, comprising:

a memory cell array including a plurality of cell strings each being electrically connected to corresponding bit lines, wherein among the corresponding bit lines, two adjacent bit lines constitute a bit line pair; and a first and a second page buffers, connected to a bit line pair, each page buffer including, a high voltage circuit for selecting one bit line of a corresponding bit line pair to couple the selected bit line to a sense line, and a low voltage circuit coupled to the selected bit line pair, for sensing cell data via the bit line pair, said low voltage circuit including a latch circuit, a first switch transistor and a pre-charge transistor, the first switch transistor connecting the selected bit line to the sense line, where adjacent sense lines of the first and the second page buffers are step-wise arranged so as to not overlap in a direction orthogonal to the bit lines, a control signal is supplied to a gate of the first switch transistor, and the pre-charge transistor is connected to the sense line to pre-charge the sense line to a desired voltage level.

27. The flash memory of claim 26, wherein the control signal has different voltages for a bit line precharging interval, a sense interval, and a latch interval.

28. The flash memory of claim 26, wherein the low voltage circuit further including a second switch transistor.

29. The flash memory of claim 28, the second switch transistor connecting the sense line and a node of the latch circuit.

30. The flash memory of claim 28, the second switch transistor connecting the selected bit line and a node of the latch circuit.

31. The flash memory of claim 28, wherein the second switch transistor turns on during a page buffer reset period.

32. A flash memory, comprising:

a memory cell array including a plurality of cell strings each electrically connected to corresponding bit lines, wherein among the corresponding bit lines, two adjacent bit lines constitute a bit line pair; and a plurality of page buffers, connected to a bit line pair, each page buffer including, a bit line select and bias circuit for selecting one bit line of a corresponding bit line pair to couple the selected bit line to a sense line, a sense and latch circuit coupled to the bit line pair, for sensing cell data via the bit line pair, the sense and latch circuit including at least one latch unit, a first switch transistor, connecting the bit line select and bias circuit and the sense line, a second switch transistor, connecting the sense line and a node of the latch unit, and a pre-charge transistor, connected to the sense line to pre-charge the sense line to a desired voltage level.

33. The flash memory of claim 32, wherein the first switch transistor is controlled by at least three voltage levels.

34. The flash memory of claim 32, wherein the second switch transistor turns on during a page buffer reset.

35. A flash memory, comprising:

a memory cell array including a plurality of cell strings each being electrically connected to corresponding bit lines, wherein among the corresponding bit lines, two adjacent bit lines constitute a bit line pair; and a plurality of page buffers, connected to a bit line pair, each page buffer including, a bit line select and bias circuit for selecting one bit line of a corresponding bit line pair to couple the selected bit line to a sense line, a sense and latch circuit coupled to the bit line pair, for sensing cell data via the bit line pair, the sense and latch circuit including at least one latch unit, a first switch transistor, connecting the bit line select and bias circuit and the sense line, a second switch transistor, connecting the bit line select and bias circuit and a node of the latch unit, and a pre-charge transistor, connected to the sense line to pre-charge the sense line to a desired voltage level.

36. The flash memory of claim 35, wherein the first switch transistor is controlled by at least three voltage levels.

37. The flash memory of claim 35, wherein the second switch transistor turns on during the page buffer reset.

38. A page buffer of a flash memory, the page buffer comprising:

a bit line select and bias circuit for selecting one bit line of a bit line pair corresponding to the page buffer, to couple the selected bit line to a sense line;

a first switch transistor, connecting the bit line select and bias circuit and the sense line;

a sense and latch circuit coupled to the bit line pair, for sensing cell data via the bit line pair, the sense and latch circuit including, at least one latch unit, and a second switch transistor, connecting the bit line select and bias circuit and a node of the at least one latch unit; and a pre-charge transistor, connected to the sense line to pre-charge the sense line to a desired voltage level.

39. A circuit for a flash memory, the circuit comprising:

a first switch transistor, connected to a sense node;

at least one latch unit for latching cell data;

a second switch transistor, connecting the first switch transistor and a node of the at least one latch unit, wherein the sense node is between the first switch transistor and the second switch transistor; and a pre-charge transistor, connected to the sense node to pre-charge the sense node to a desired voltage level.

* * * * *